(12) United States Patent
Chiu et al.

(10) Patent No.: US 7,184,456 B2
(45) Date of Patent: Feb. 27, 2007

(54) DUAL WAVELENGTH SEMICONDUCTOR LASER EMITTING APPARATUS AND MANUFACTURING METHOD THEREOF

(75) Inventors: Shu-Wei Chiu, Taipei (TW); Chih-Sung Chang, Taoyuan (TW)

(73) Assignee: Epistar Corporation, Hsinchu (TW)

( * ) Notice: Subject to any disclaimer, the term of this patent is extended or adjusted under 35 U.S.C. 154(b) by 263 days.

(21) Appl. No.: 10/953,984

(22) Filed: Sep. 28, 2004

(65) Prior Publication Data

US 2005/0243880 A1    Nov. 3, 2005

(30) Foreign Application Priority Data

Apr. 30, 2004    (TW) ................ 93112312 A

(51) Int. Cl.
 *H01S 3/14* (2006.01)
(52) U.S. Cl. ................ 372/68; 372/43.01
(58) Field of Classification Search .............. 372/68
See application file for complete search history.

(56) References Cited

U.S. PATENT DOCUMENTS 5,071,786 A * 12/1991 Paoli .................. 438/35
6,468,820 B2    10/2002 Narui
2003/0197204 A1  10/2003 Miyazaki et al.

\* cited by examiner

*Primary Examiner*—Dung Nguyen
(74) *Attorney, Agent, or Firm*—Ingrassia, Fisher & Lorenz, P.C.

(57) ABSTRACT

A dual wavelength semiconductor laser emitting apparatus including a substrate having a first laser emitting device and a second laser emitting device, and a manufacturing method thereof are provided. The manufacturing method includes stacking an active layer of the second laser emitting device onto an upper cladding layer of the first laser emitting device, which is taken as a lower cladding layer of the second laser emitting device. Thereby the first laser emitting device and the second laser emitting device formed on the substrate possess a common electrode and respectively oscillate laser beams having different wavelengths in the semiconductor laser emitting apparatus.

18 Claims, 14 Drawing Sheets

DUAL WAVELENGTH SEMICONDUCTOR LASER EMITTING APPARATUS AND MANUFACTURING METHOD THEREOF

CROSS REFERENCE TO RELATED APPLICATIONS

This application claims priority to Taiwan Patent Application No. 093112312 entitled "Dual Wavelength Semiconductor Laser Emitting Apparatus and Manufacturing Method Thereof", filed on Apr. 30, 2004, which is incorporated herein by reference and assigned to the assignee herein.

1. Field of Invention

The present invention relates to a dual wavelength semiconductor laser-emitting apparatus and a manufacturing method thereof and, more particularly, to two different laser-emitting devices forming on the same substrate and oscillating laser beams having different wavelengths.

2. Background of the Invention

Dual wavelength semiconductor laser emitting apparatuses are conventionally fabricated by forming two different laser emitting devices on the same substrate, wherein each laser emitting device possesses its own lower cladding layer, active layer, and upper cladding layer. Such well known processes have been elaborated in some patents, for instances, U.S. Pat. No. 6,468,820 to Narui, et al., and U.S. Patent Publication Ser. No. 2003/0197204 A1 by Miyazaki et al, incorporated herein by reference. Following associated FIG. 1 is briefly described to introduce the prior art related to the present invention.

FIG. 1 illustrates the conventional structure of dual wavelength semiconductor laser emitting apparatus, which incorporates a substrate 30 being divided into a first laser emitting device region (I) and a second laser emitting device region (II). Several etching steps are involved in order to build the structure having a first lower cladding layer 111 of the first laser emitting device 10 and a second lower cladding layer 211 of the second laser emitting device 20 independently formed on the substrate 30. For example, after the step of forming the first laminate 11, an etching step removing the portion of the first laminate 11 over a region different from the region (I) is required. Such that the second laser emitting device 20 can be formed on the substrate 30 subsequently without interfering with the first laminate 11. Further, during creation of the second laminate 21, the existing first laminate 11 is easily covered, thus another step for removing portion of the second laminate 21 over the first laminate 11 is needed. Moreover, for defining the isolation well 60 between the first laser emitting device 10 and the second laser emitting device 20, another etching step is also indispensable.

As known in the art, the implementation of etching typically involves complicated procedures including forming masks first and removing the same afterwards, resulting in higher cost of the products. Therefore, there exists a need for inventing a novel semiconductor laser apparatus having a dual wavelength laser emitting devices by using a simpler method with fewer procedures.

SUMMARY OF THE INVENTION

A dual wavelength semiconductor laser emitting apparatus including a substrate having a first laser emitting device and a second laser emitting device, and a manufacturing method thereof are provided. The manufacturing method includes stacking an active layer of the second laser emitting device onto an upper cladding layer of the first laser emitting device, which is taken as a lower cladding layer of the second laser emitting device. Thereby the first laser emitting device and the second laser emitting device formed on the substrate possess a common electrode and respectively oscillate laser beams having different wavelengths.

DETAILED DESCRIPTION

Figure 1:
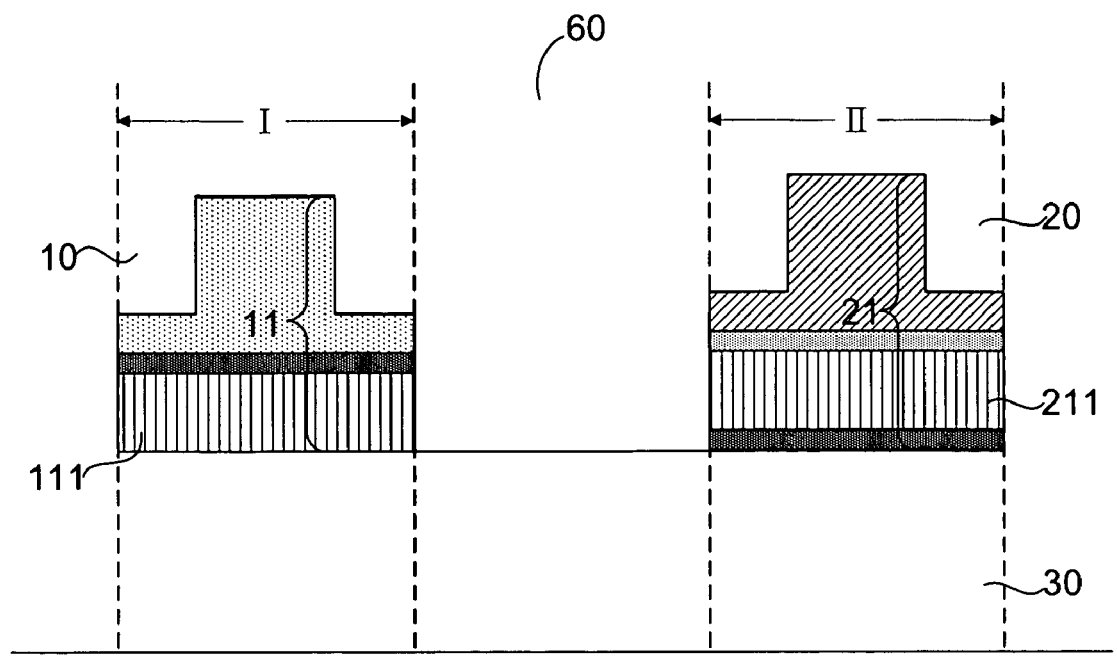
FIG. 1 shows a cross-sectional view of a conventional dual wavelength semiconductor laser emitting apparatus.
Figure 2A:
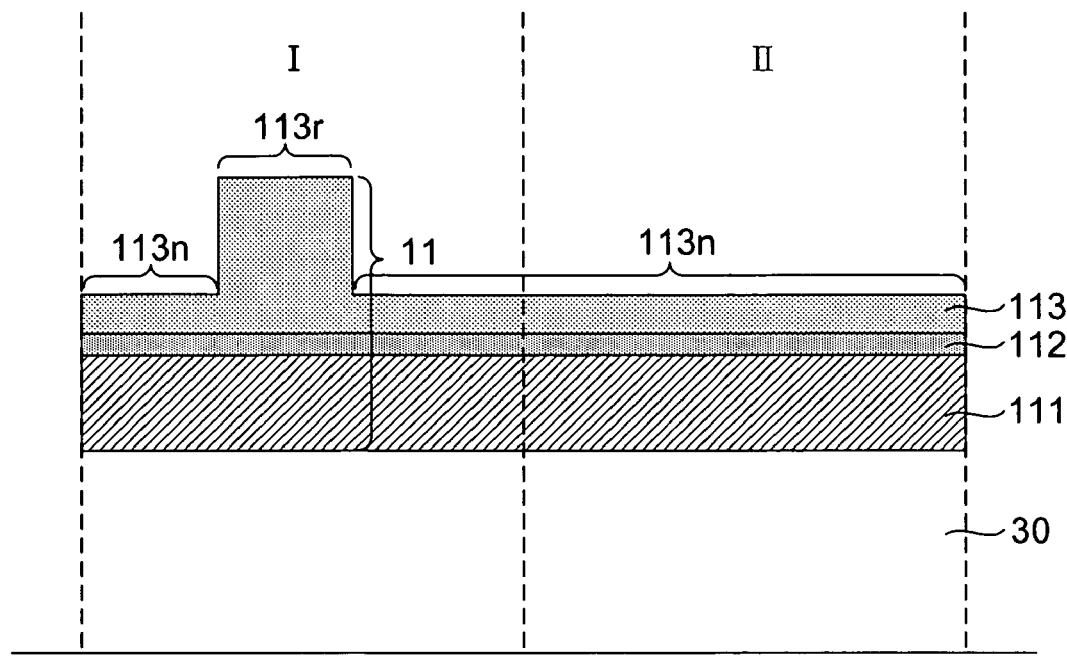
FIGS. 2a–2n show cross-sectional views of a dual wavelength semiconductor laser emitting apparatus during fabrication in accordance with the first embodiment of present invention.

The present invention provides two embodiments for forming the novel dual wavelength laser emitting apparatus. FIGS. 2a–2n illustrate the first embodiment of present invention. As shown in FIG. 2a, an n-type substrate 30 comprised of GaAs is pre-defined into a first laser emitting device region (I) and a second laser emitting device region (II). A first laminate 11 is formed onto the n-type substrate 30 by sequentially stacking a first n-type lower cladding layer 111 comprised of AlGaAs, a first active layer 112 having a multiple quantum well structure for oscillating a laser beam of a specific wavelength, and a first p-type upper cladding layer 113 comprised of AlGaAs. Then, shaping the first p-type upper cladding layer 113 by etching, a first ridge-shape current injection region 113r of the first p-type upper cladding layer 113 in the region (I) is formed. The portion of the first p-type upper cladding layer 113 other than the first ridge-shape current injection region 113r is referred as the first non ridge-shape current injection region 113n.

Figure 2B:
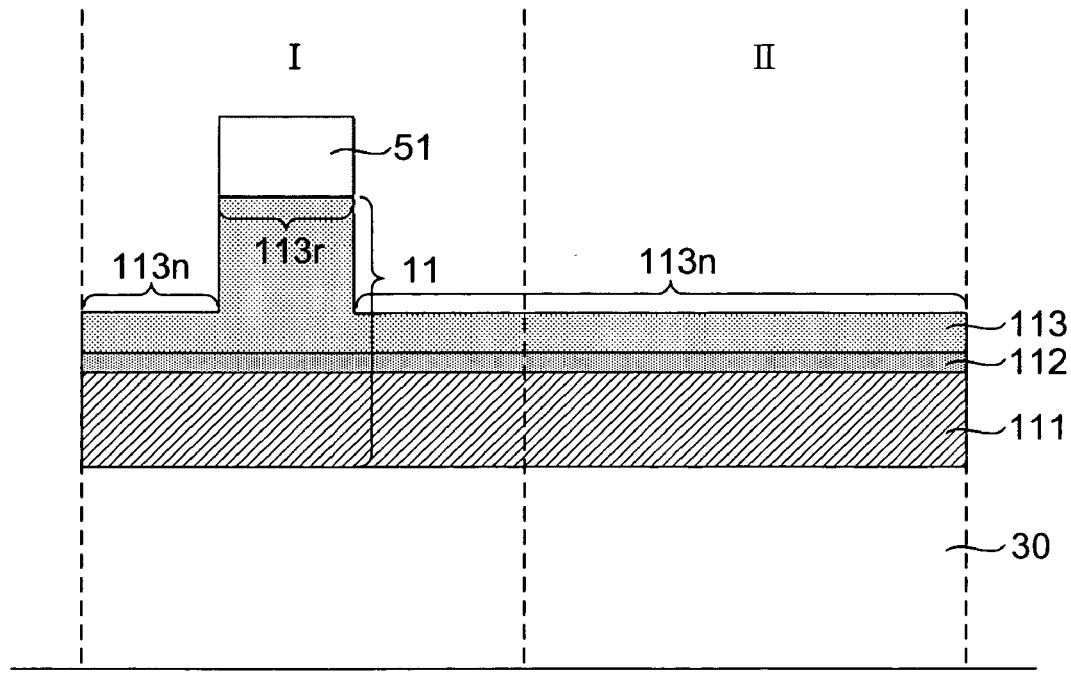
Figure 2C:
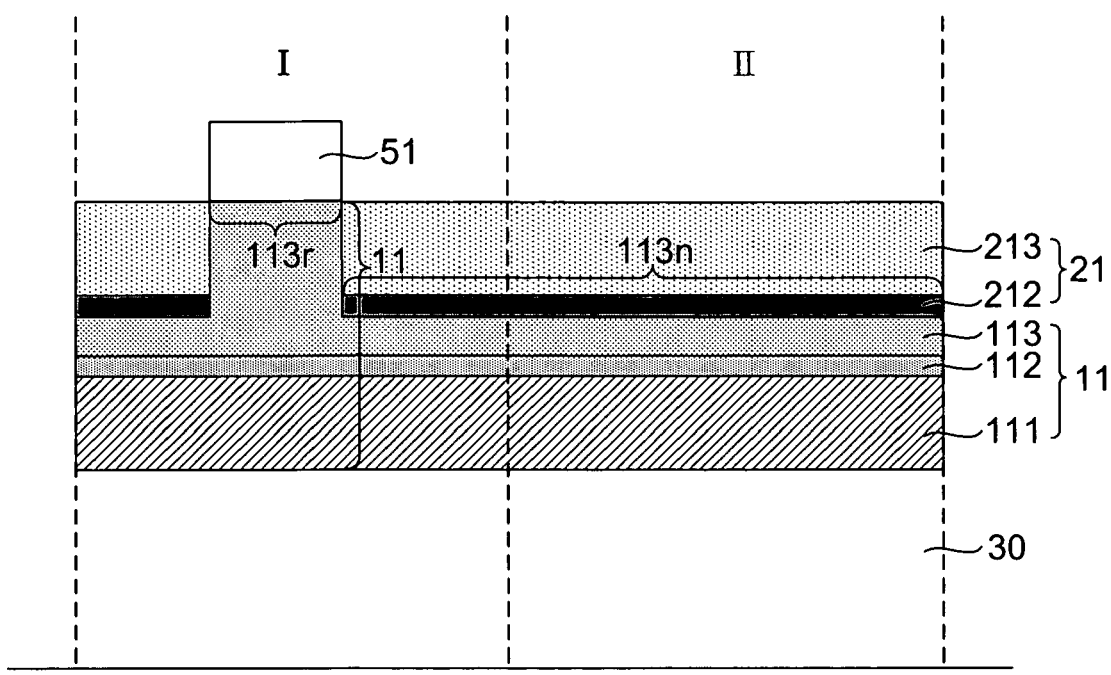

As shown in FIG. 2b, a mask 51 is stacked atop the first ridge-shape current injection region 113r by general lithographic process. Then, referring to FIG. 2c, a second active layer 212 and a second n-type upper cladding layer 213, both constituting the second laminate 21, are sequentially stacked atop the first non ridge-shape current injection region 113n by using a metal organic vapor phase epitaxial growth (MOVPE) method selective to mask 51. In the embodiment, the second active layer 212 possesses a multiple quantum well structure different from that of the first active layer 112, therefore, each of them can oscillate laser beams in different wavelengths, for instance, 650 nm and 780 nm respectively. Typically, the second n-type upper cladding layer 213 is composed of AlGaAs.

Figure 2D:
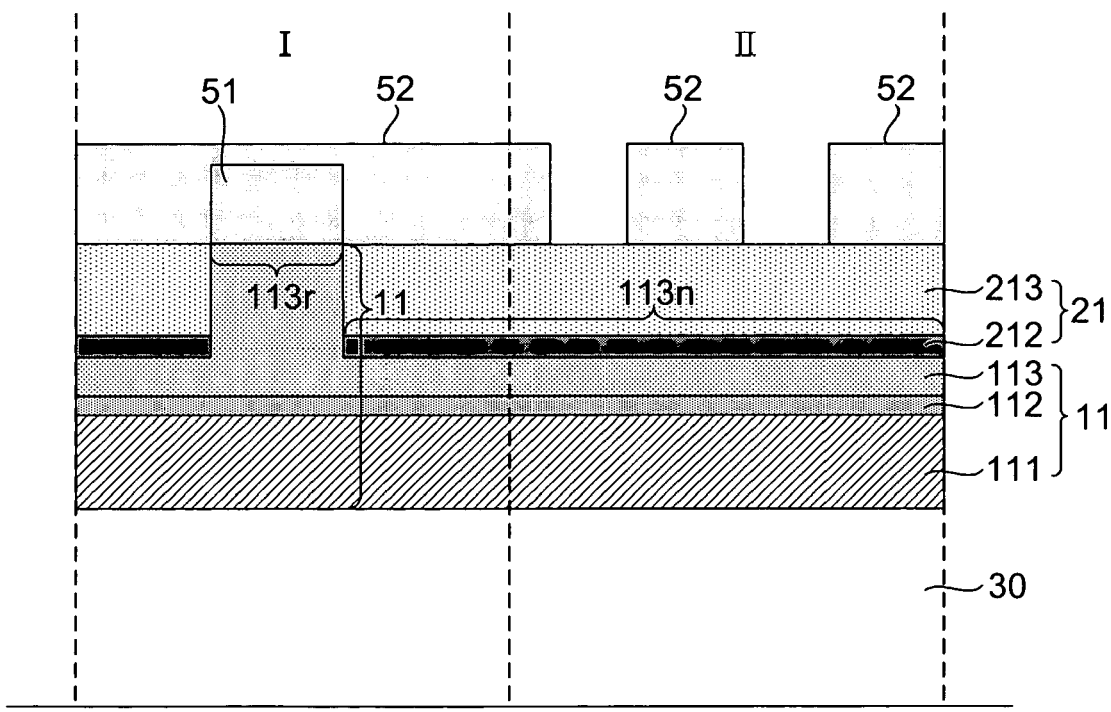
Figure 2E:
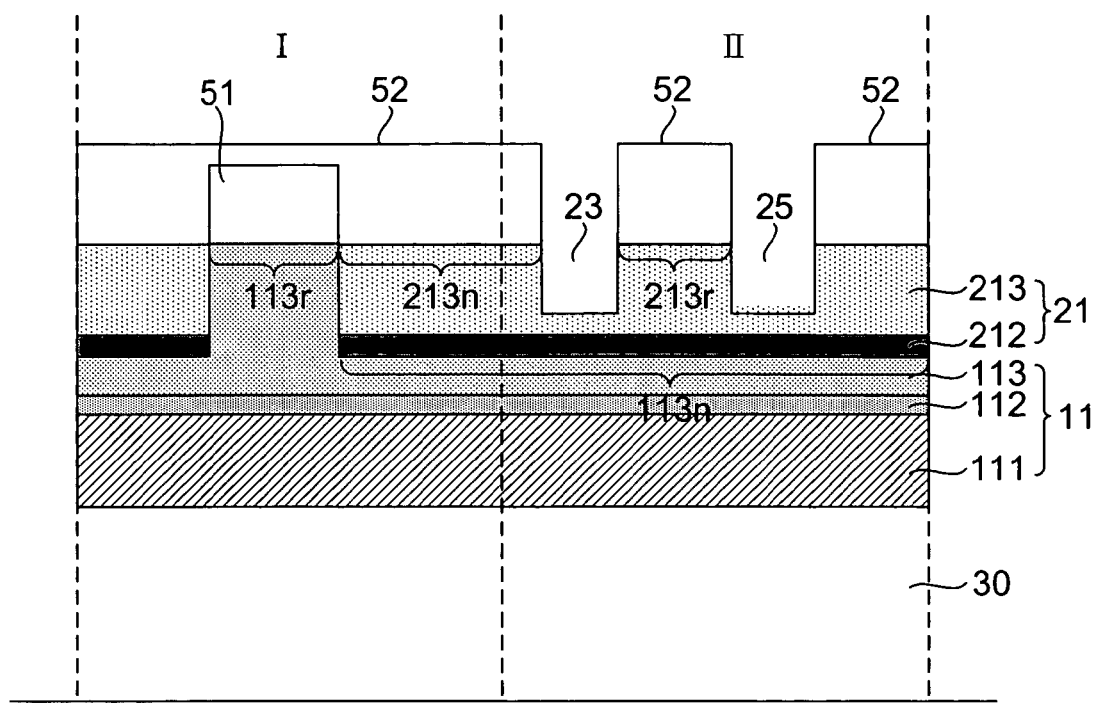
Figure 2F:
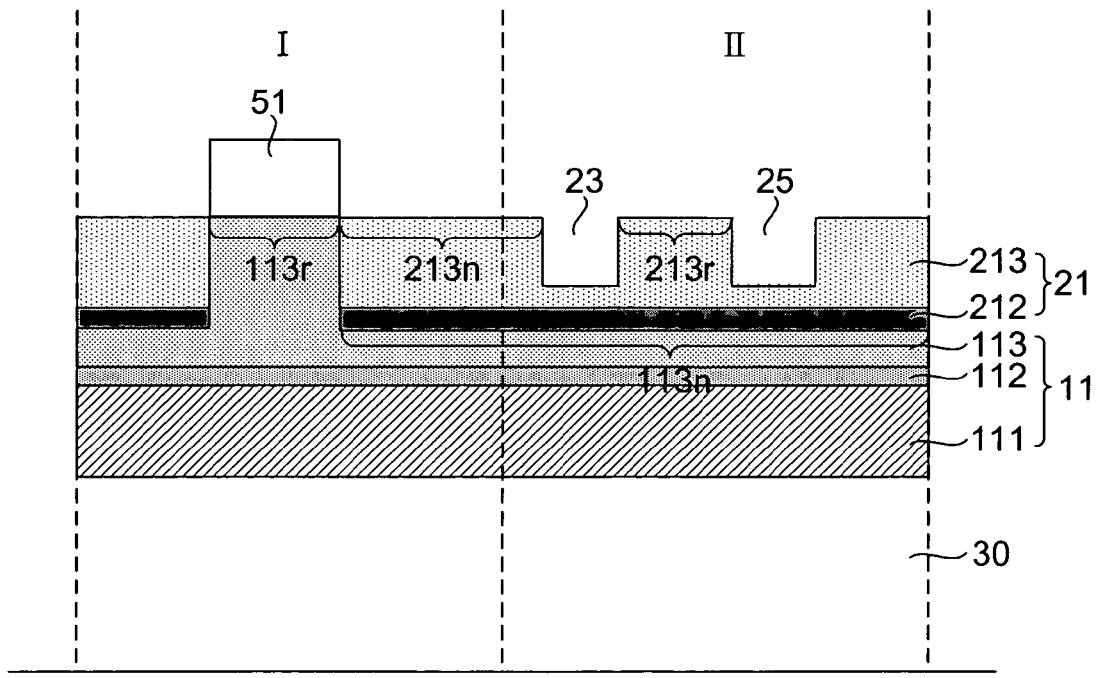

Next, referring to FIG. 2d, a patterned mask 52 is stacked atop the second laminate 21. Then, referring to FIG. 2e, by etching the second n-type upper cladding layer 213, a trench 23 and a trench 25 in the region (II) are defined. The rate of etching in the step should be carefully controlled to avoid penetration into the second active layer 212. That is, the bottoms of the trench 23 and the trench 25 are still the portions of the second n-type upper cladding layer 213. As shown in FIG. 2f, after removing the mask 52, a second ridge-shape current injection region 213r of the second n-type upper cladding layer 213 is formed in-between the trench 23 and the trench 25. The portion of the second n-type upper cladding layer 213, exclusive of the second ridge-shape current injection region 213r, the trench 23, and the trench 25, is referred as the second non ridge-shape current injection region 213n.

Figure 2G:
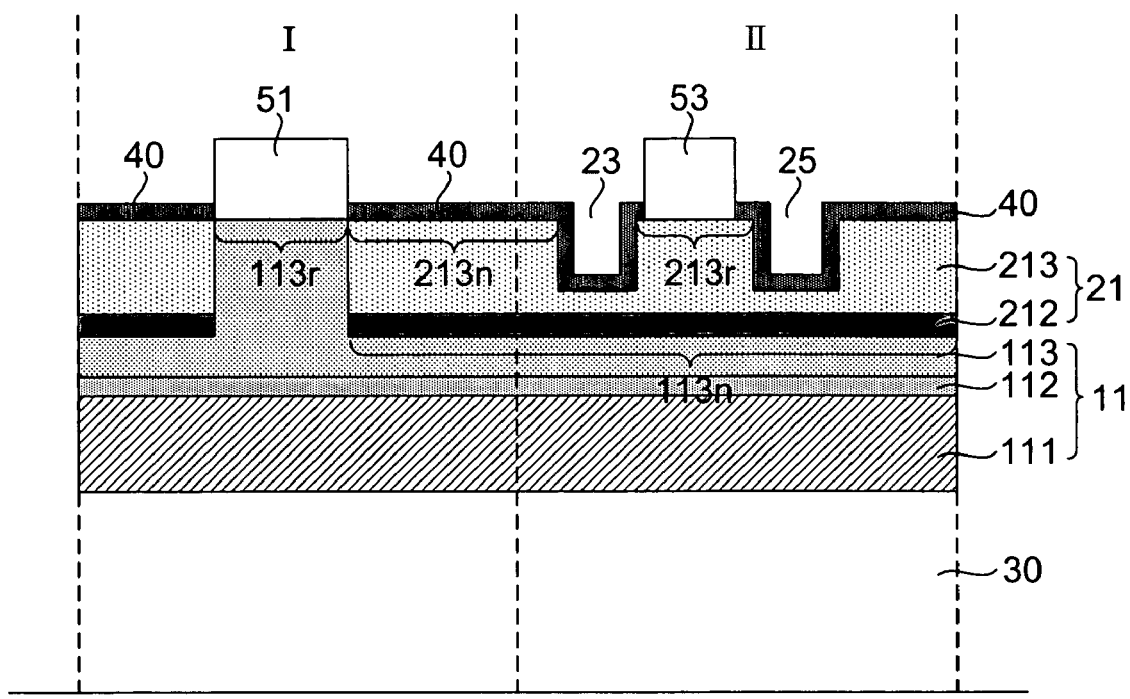

Now referring to FIG. 2g, after stacking a mask 53 atop the second ridge-shape current injection region 213r, a passive layer 40 is conformally formed over the surface of the second non ridge-shape current injection region 213n by conventional deposition methods, such as CVD or PVD etc, selective to mask 51 and mask 53. The passive layer 40, composed of any insulating materials such as Si, O or N, is used for isolating the second non ridge-shaped current injection region 213n from a second n-type ohmic contact layer 27 to be formed later.

Figure 2H:
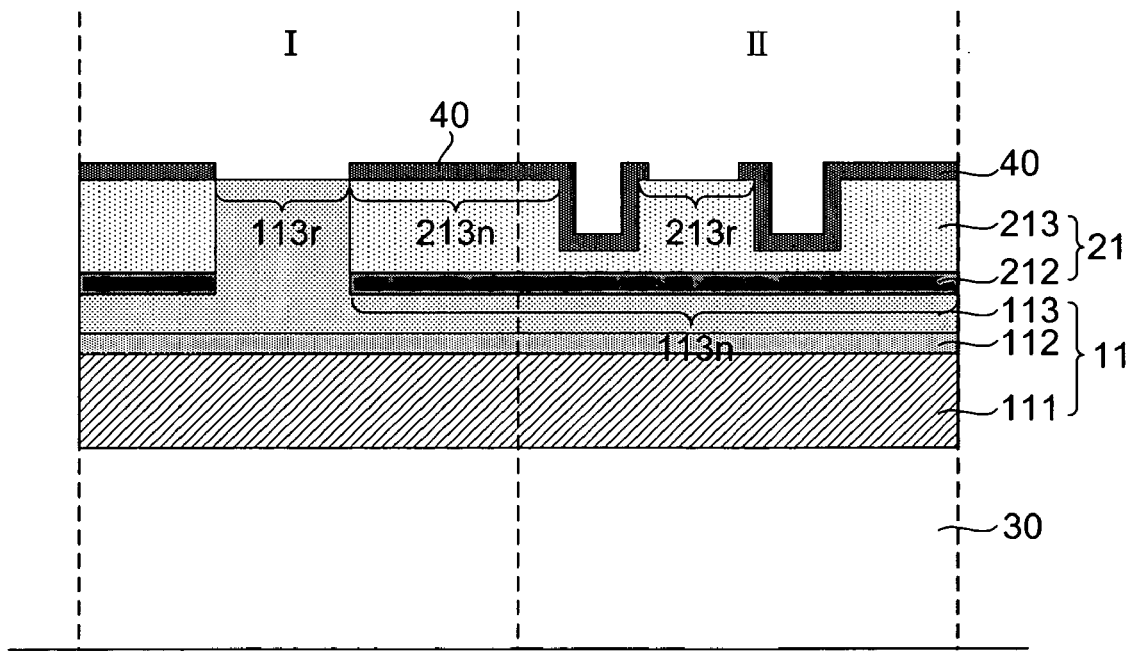
Figure 2I:
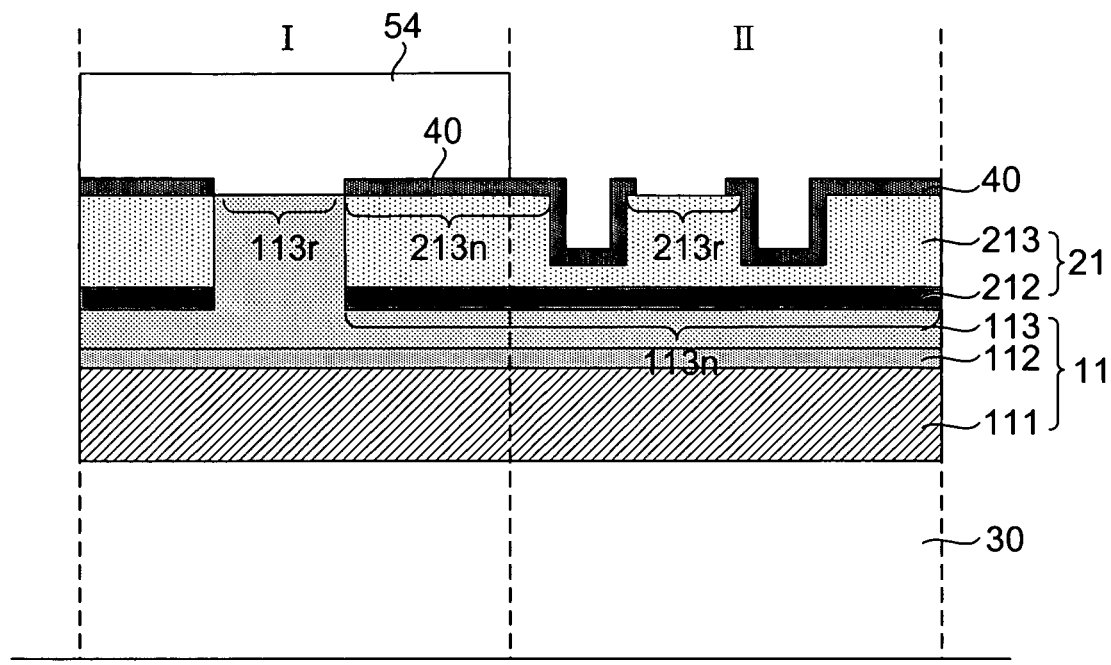
Figure 2J:
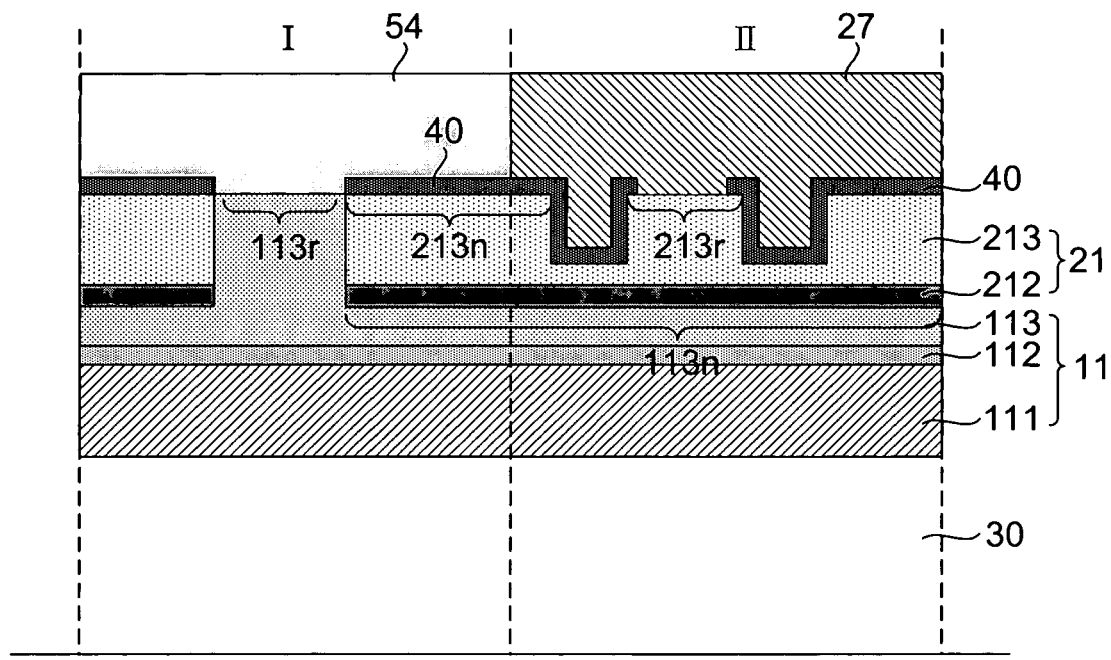
Figure 2K:
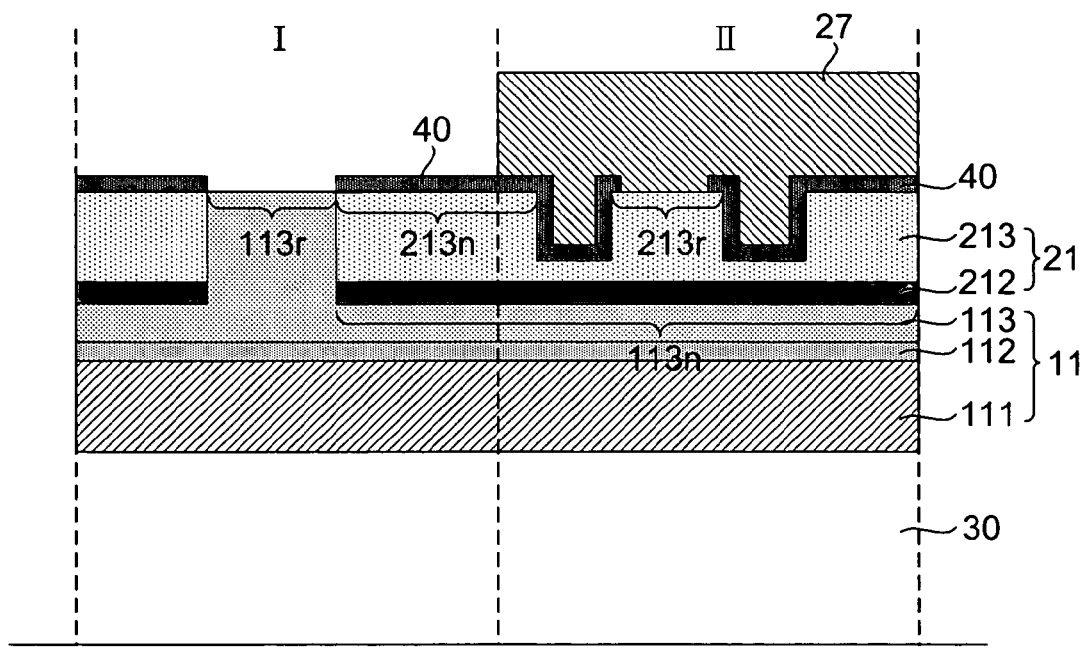

By referring FIGS. 2h–2k, the formation of the second n-type ohmic contact layer 27 in the region (II) is detailed hereafter. As shown in FIG. 2h, mask 51 and mask 53 are removed by a selective etching method. Then, as shown in FIG. 2i, a mask 54 is stacked over the portion of the passive layer 40 and the first ridge-shape current injection region 113r in the region (I). After that, by using a PVD method selective to the mask 54, a second n-type ohmic contact layer 27, made from any suitable conductive metals, is deposited over the exposed portion of the passive layer 40 and the second ridge-shape current injection region 213r in the region (II), as shown in FIG. 2j. Then, the mask 54 is removed by a selective etching method as shown in FIG. 2k.

Figure 2L:
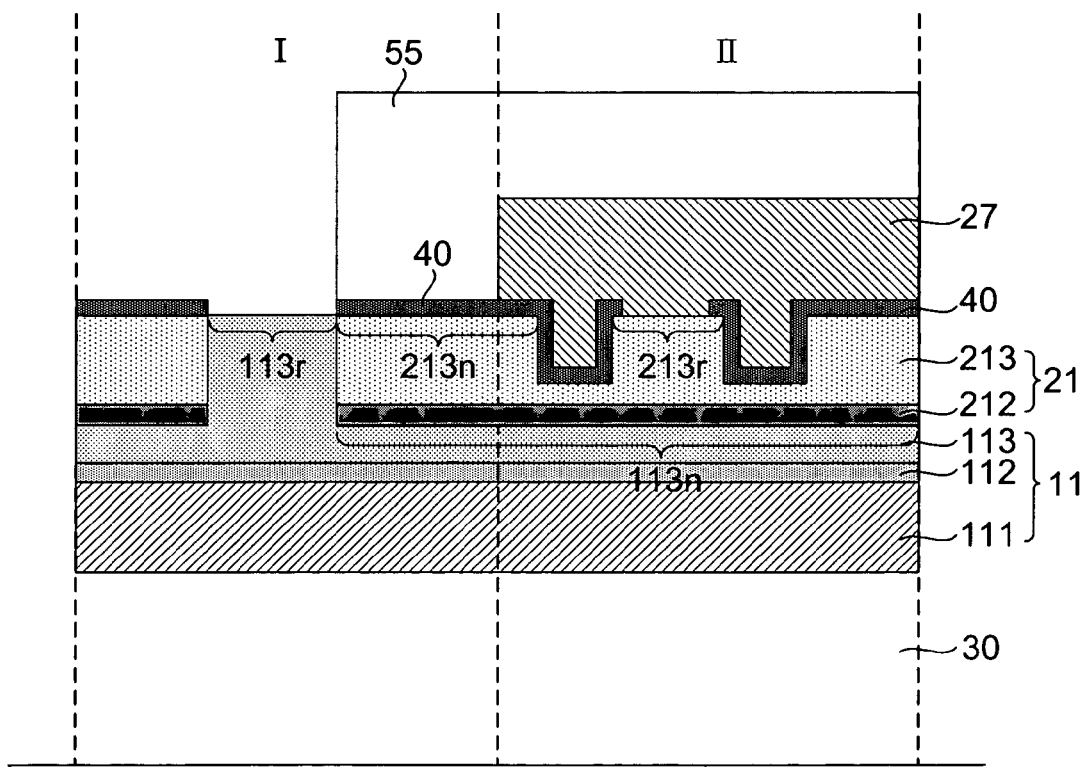
Figure 2M:
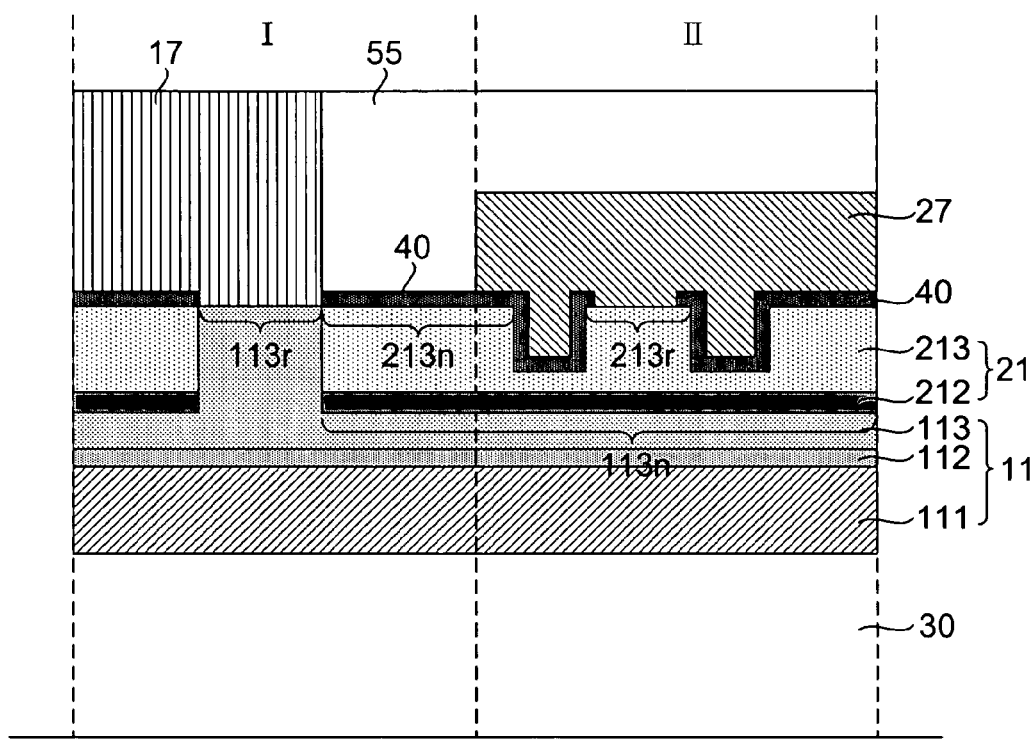
Figure 2N:
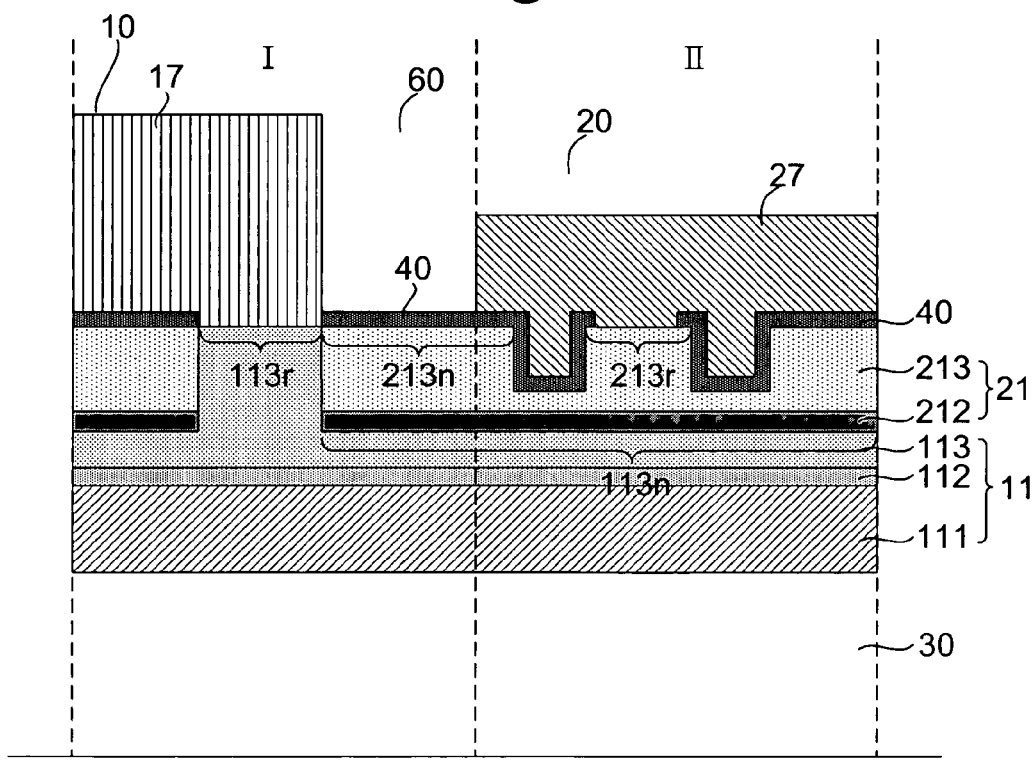

By referring FIGS. 2l–2n, the formation of a first p-type ohmic contact layer 17 in the region (I) is detailed hereinafter. As shown in FIG. 2l, a mask 55 is stacked over the second n-type ohmic contact layer 27 as well as the portion of the passive layer 40 in-between the first ridge-shape current injection region 113r and the second n-type ohmic contact layer 27. After that, referring to FIG. 2m, by using a PVD method selective to the mask 55, the first p-type ohmic contact layer 17, made from any suitable conductive metals, is deposited onto the exposed portion of the passive layer 40 and the first ridge-shape current injection region 113r in the region (I). Finally, referring to FIG. 2n, after removing the mask 55 by a selective etching method, an isolation well 60 between the first p-type ohmic contact layer 17 and the second n-type ohmic contact layer 27 is then defined.

FIG. 2n illustrates the dual wavelength semiconductor laser emitting apparatus in accordance with the first embodiment of the present invention. The apparatus includes a first laser emitting device 10 and the second laser emitting device 20 formed on the same substrate 30, wherein the second active layer 212 of the second laser emitting device 20 is stacked directly onto the first p-type upper cladding layer 113 of the first laser emitting device 10. Thereby the first laser emitting device 10 and the second laser emitting device 20 possess a common anode, e.g. the first p-type ohmic contact layer 17. To operate the apparatus, a ground terminal is connected to the common anode 17, while the signal line 1 of the first laser emitting device 10 and the signal line 2 of the second laser emitting device 20 are respectively connected to the first n-type lower cladding layer 111 and the second n-type ohmic contact layer 27. In such manner, only the first laser emitting device 10 can work by concurrently applying positive bias to the signal line 1 and negative bias to the signal line 2. On the contrary, only the second laser emitting device 20 can work by concurrently applying negative bias to the signal line 1 and positive bias to the signal line 2. Therefore, each of the first and the second laser emitting device 10 and 20 on the same substrate 30 is respectively oscillating specific laser beam at different times. It is noted that, the ground terminal of the apparatus in the present invention is connected to the first p-type ohmic contact layer 17 rather than the substrate 30 used to be grounded in the prior art.

Slightly varying the materials thereof in light of the above teachings can make a common cathode structure by persons skilled in the art, which is also the intended scope of protection of the appended claims.

Figure 3A:
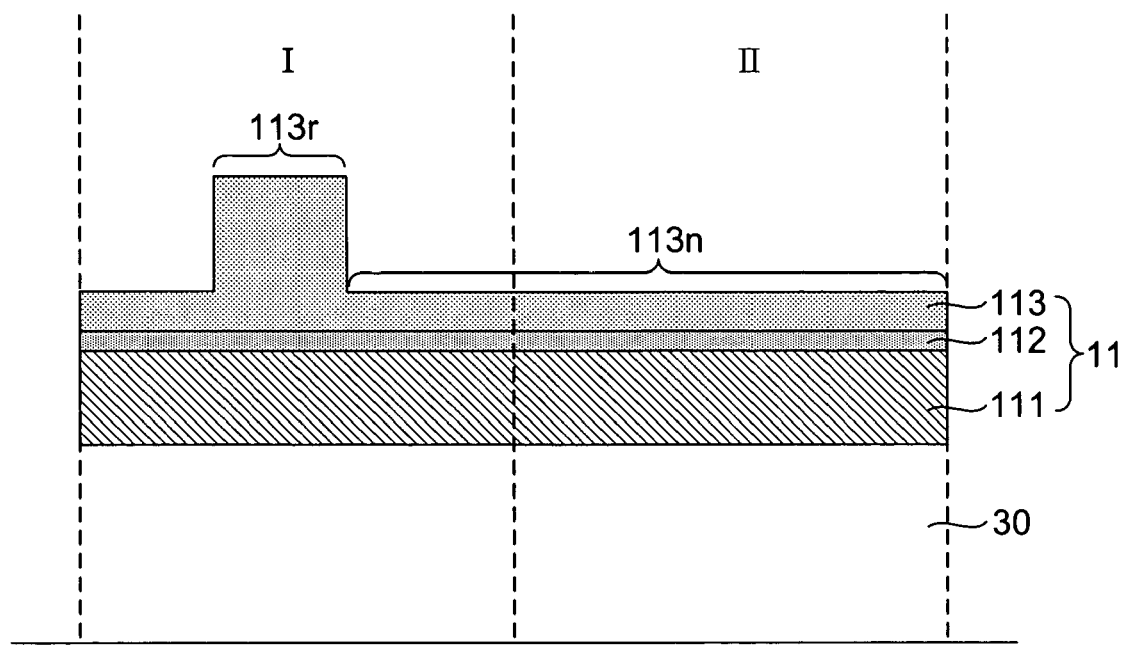
FIGS. 3a–3l show cross-sectional views of a dual wavelength semiconductor laser emitting apparatus during fabrication in accordance with the second embodiment of present invention.
Figure 3B:
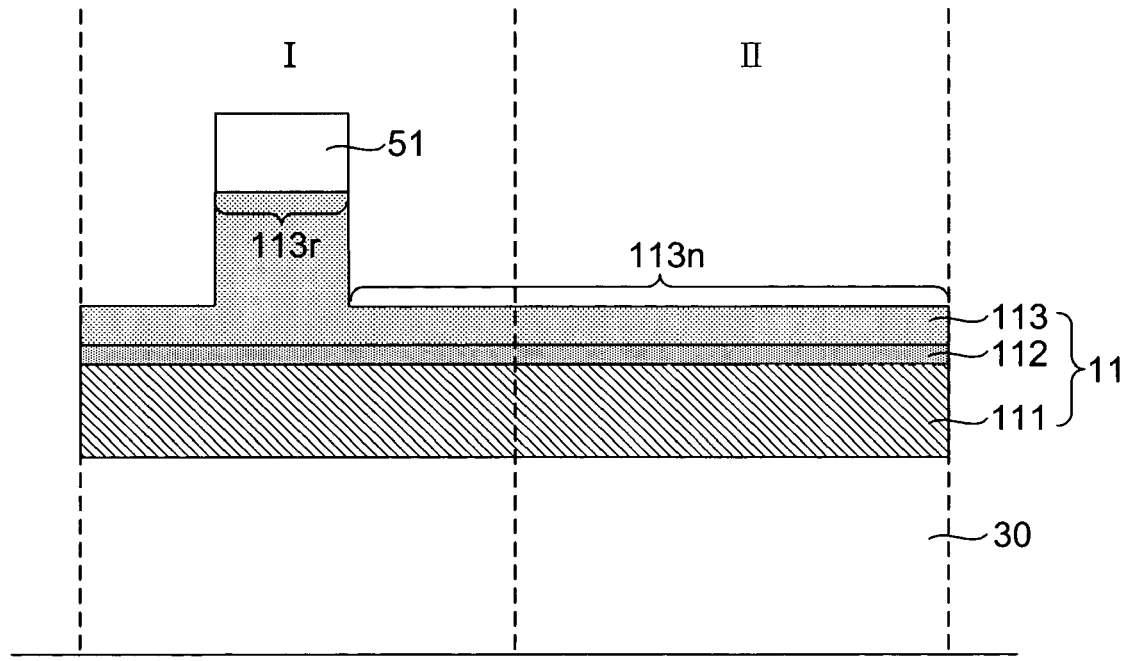
Figure 3C:
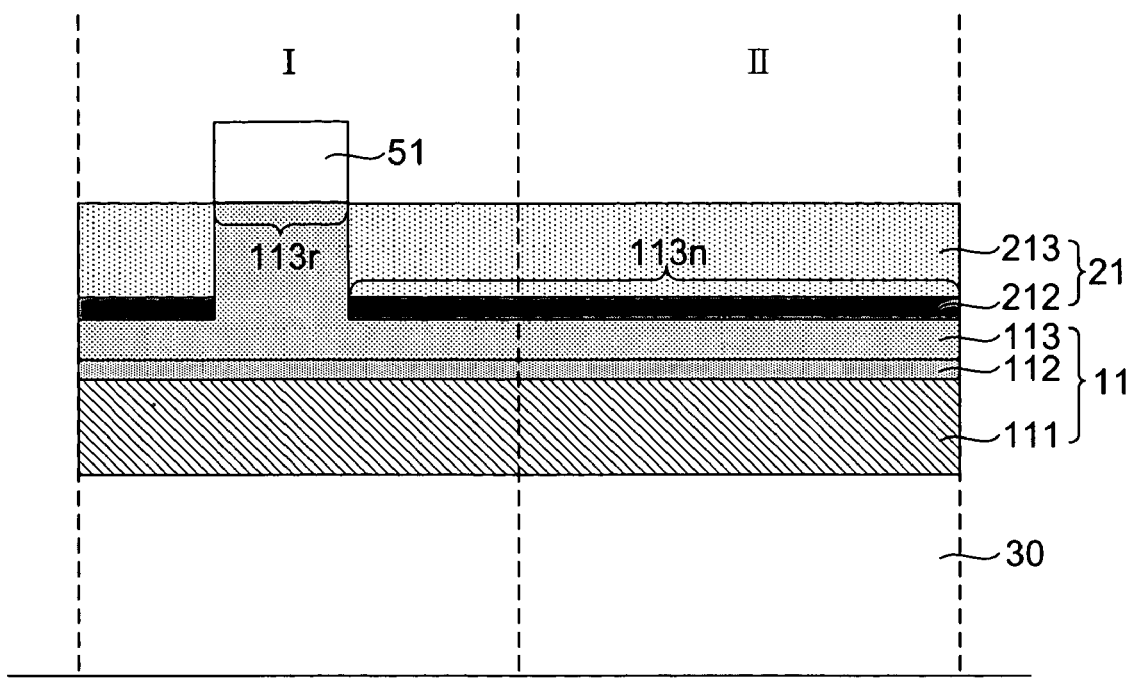
Figure 3D:
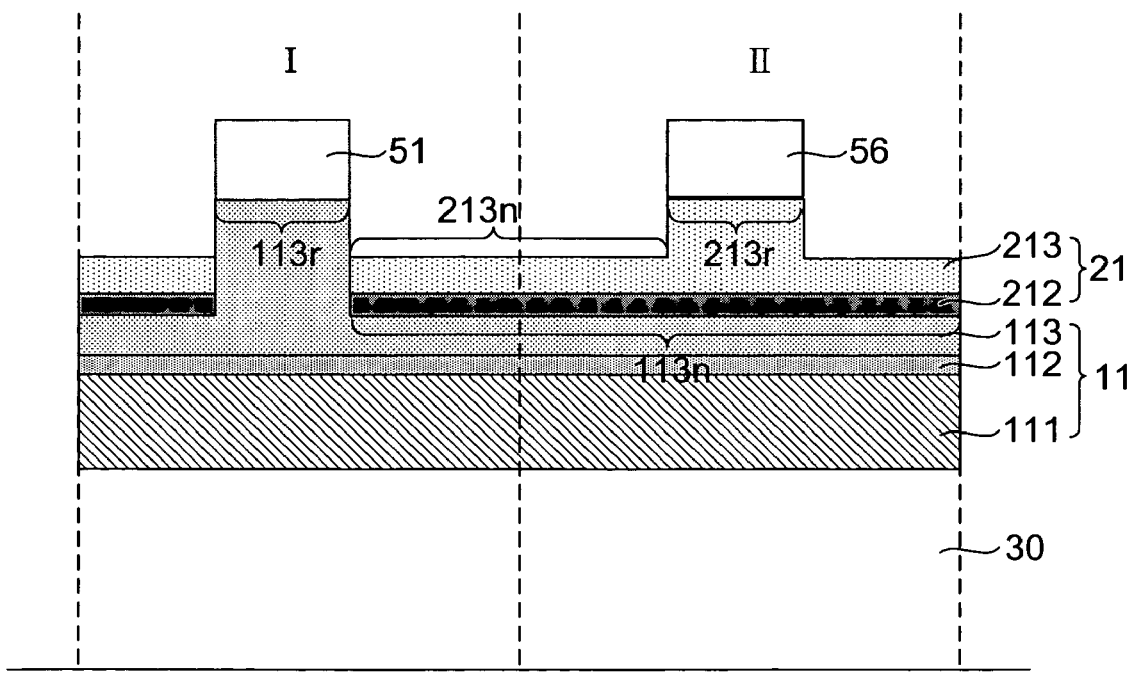

FIGS. 3a–3l illustrate the second embodiment of the present invention, in which elements similar to those in the first embodiment are numbered alike, and the steps shown in FIGS. 3a–3c are correspondent with FIGS. 2a–2c. Now referring to FIG. 3d, a mask 56 is formed atop the second n-type upper cladding layer 213 in the region (II). Then, the exposed portion of the second n-type upper cladding layer 213 is etched selectively. Similarly, the rate of etching in the step of FIG. 3d should be carefully controlled to avoid penetration into the second active layer 212. Thereby, the portion of the second n-type upper cladding layer 213 covered by the mask 56 is shaped as a second ridge-shape current injection region 213r. The portion of the second n-type upper cladding layer 213 exclusive of the second ridge-shape current injection region 213r is referred as the second non ridge-shape current injection region 213n.

Figure 3E:
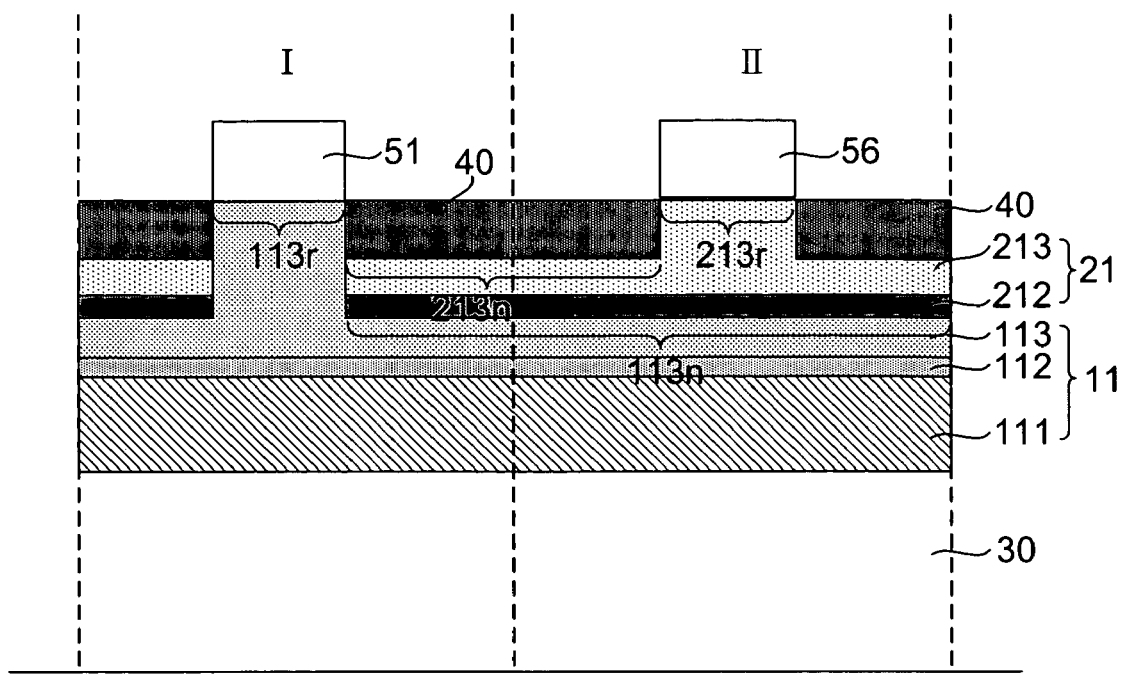

Referring to FIG. 3e, selective to mask 51 and mask 56, a passive layer 40 is formed atop the second non ridge-shape current injection region 213n by conventional deposition methods such as CVD or PVD etc. The passive layer 40, made from any insulating materials composed of Si, O, or N, is used for isolating the second non ridge-shaped current injection region 213n from a second n-type ohmic contact layer 27 to be made later.

Figure 3F:
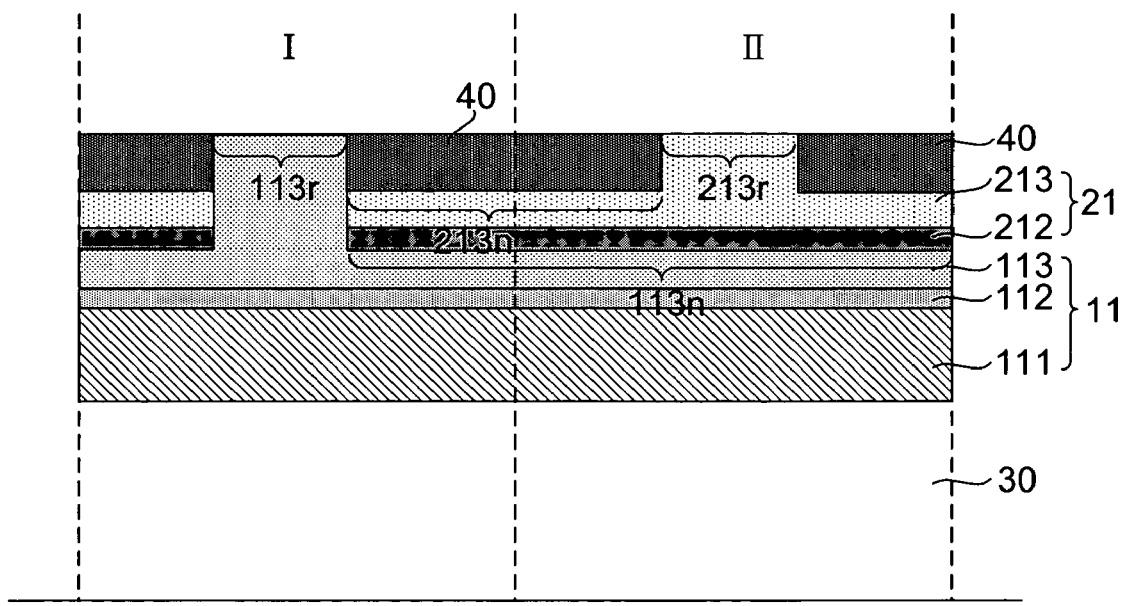
Figure 3G:
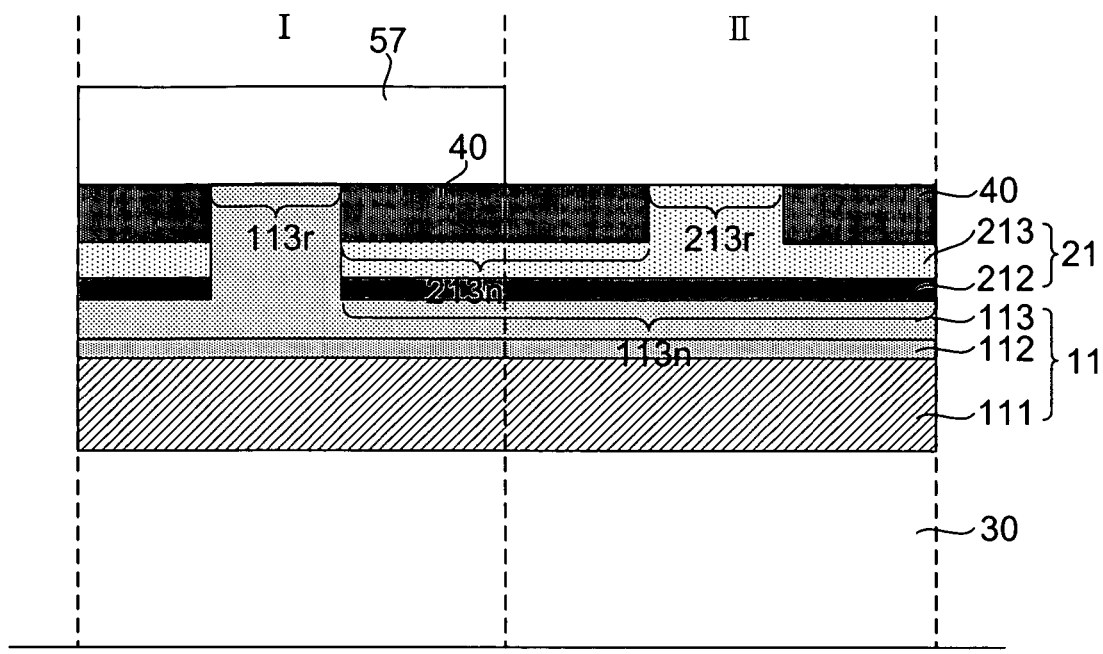
Figure 3H:
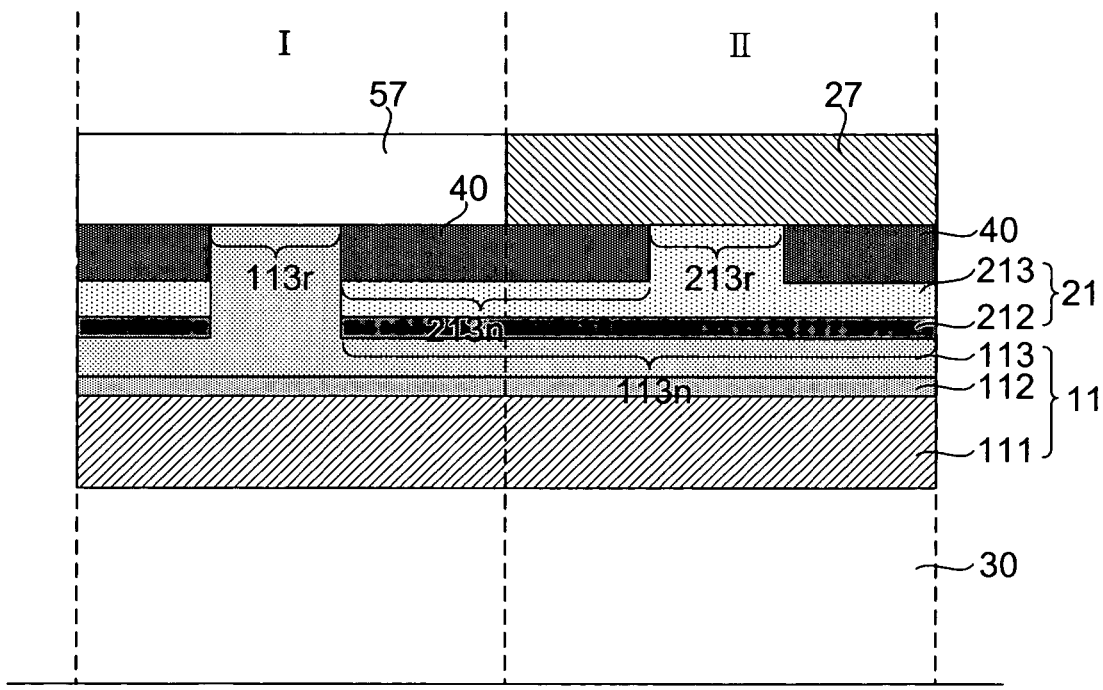
Figure 3I:
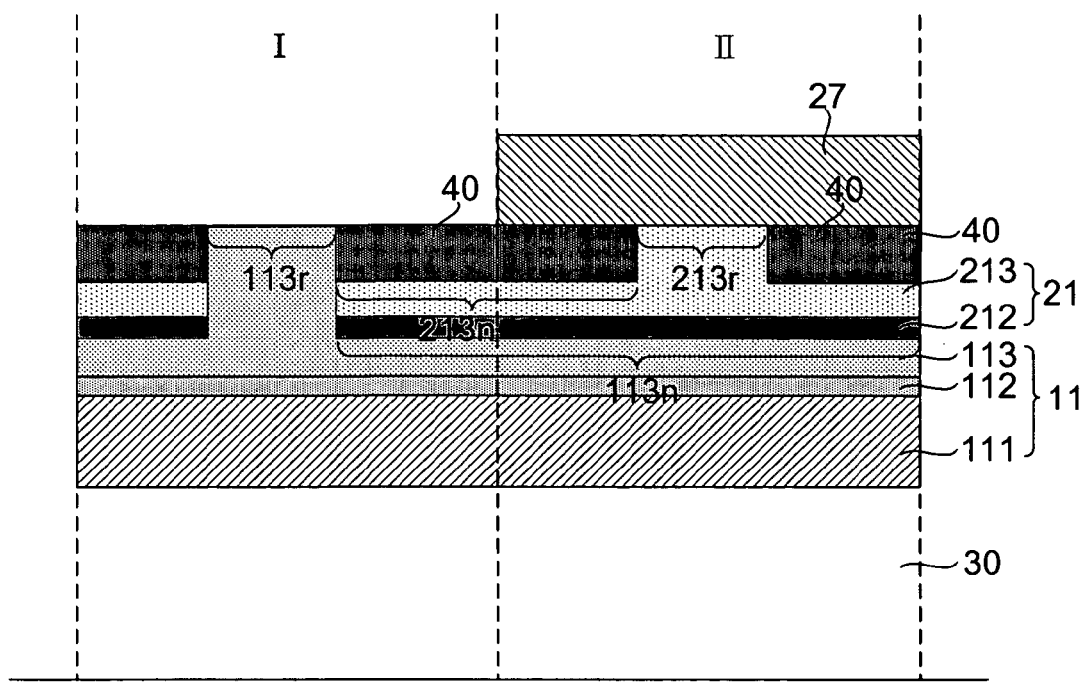

By referring FIGS. 3f–3i, the formation of the second n-type ohmic contact layer 27 in the region (II) is detailed hereinafter. Referring to FIG. 3f, mask 51 and mask 56 are removed by a selective etching method. Then, as shown in FIG. 3g, a mask 57 is stacked over the portion of the passive layer 40 and the first ridge-shape current injection region 113r in the region (I). After that, as shown in FIG. 3h, by using a PVD method selective to mask 57, the second n-type ohmic contact layer 27 made from any suitable conductive metals is deposited over the passive layer 40 and second ridge-shape current injection region 213r in the region (II). Following that, a mask 57 is removed by a selective etching method as shown in FIG. 3i.

Figure 3J:
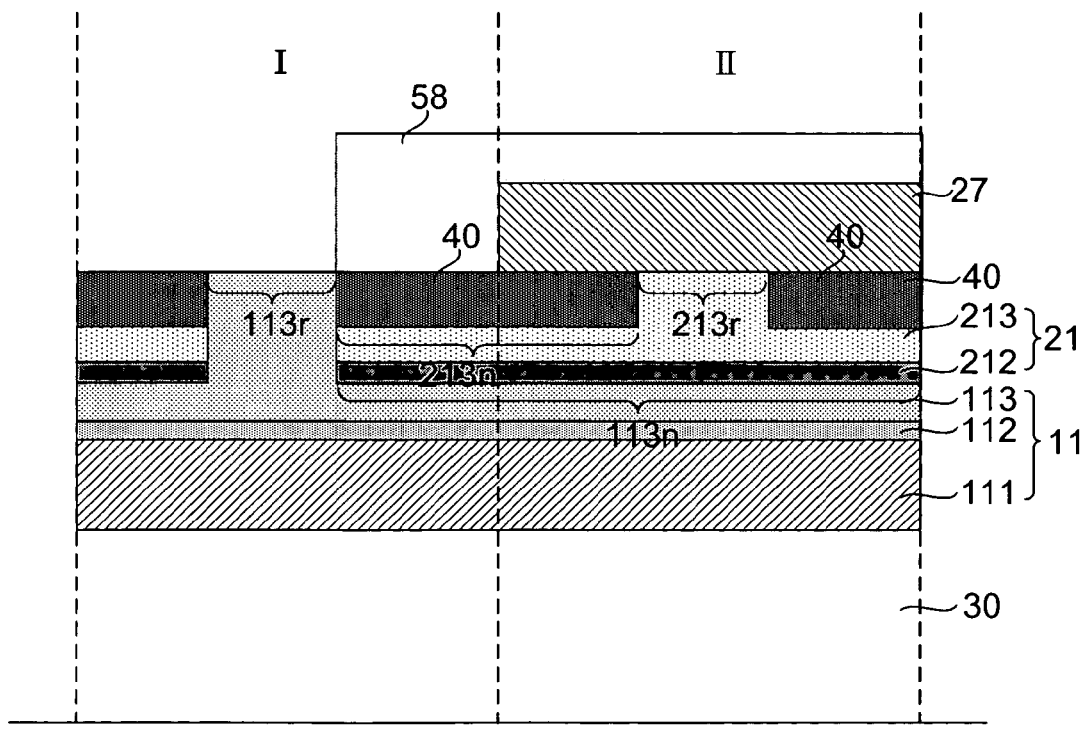
Figure 3K:
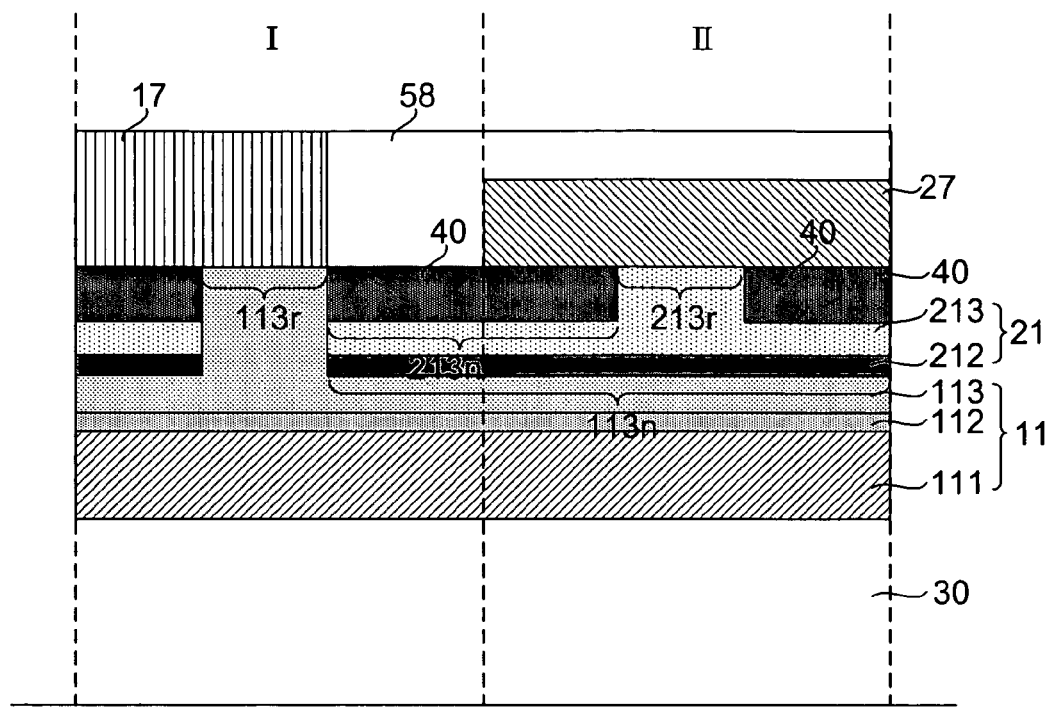

By referring FIGS. 3j–3l, the formation of a first p-type ohmic contact layer 17 in the region (I) is detailed hereinafter. As shown in FIG. 3j, a mask 58 is formed atop the second n-type ohmic contact layer 27 and the portion of the passive layer 40 in-between the first ridge-shape current injection region 113r and the second n-type ohmic contact 27. Then, as shown in FIG. 3k, by using a PVD method selective to the mask 58, the first p-type ohmic contact layer 17, made from any suitable conductive metals, is deposited onto the exposed portion of the passive layer 40 and the first ridge-shape current injection region 113r in the region (I). Finally, referring to FIG. 3l, after removing the mask 58 by a selective etching method, an isolation well 60 between the first p-type ohmic contact layer 17 and the second n-type ohmic contact layer 27 is then defined.

Figure 3L:
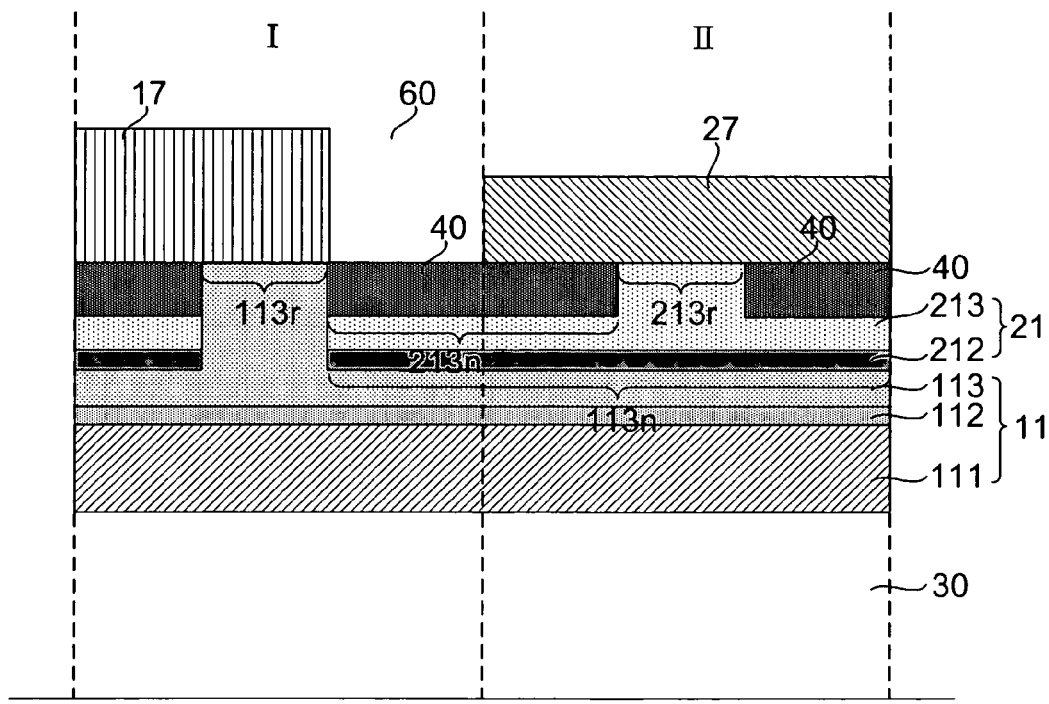

FIG. 3l illustrate the dual wavelength semiconductor laser emitting apparatus in accordance with the second embodiment, wherein the first laser emitting device 10 and the second laser emitting device 20 also possess a common anode (e.g. the first p-type ohmic contact layer 17). Therefore, operation of the apparatus of the second embodiment is the same as the first embodiment. Likewise, slightly varying the materials thereof in light of the above teachings can make a common cathode structure by persons skilled in the art, which is also the intended scope of protection of the appended claims.

The present invention has been described above with reference to preferred embodiments. However, those skilled in the art will understand that the scope of the present invention need not be limited to the disclosed preferred embodiments. On the contrary, it is intended to cover various modifications and equivalent arrangements within the scope defined in the following appended claims. The scope of the claims should be accorded the broadest interpretation so as to encompass all such modifications and equivalent arrangements.

What is claimed is:

1. A dual wavelength semiconductor laser emitting apparatus comprising:
    a substrate;
    a first laser emitting device, formed on said substrate, having a first lower cladding layer, a first active layer and a first upper cladding layer, said first upper cladding layer comprising a first ridge-shape current injection; and
    a second laser emitting device, formed on said substrate, having a second lower cladding layer, a second active layer and a second upper cladding layer;
    wherein said second active layer is stacked atop said first upper cladding layer making said first upper cladding layer as said second lower cladding layer of said second laser emitting device.

2. The apparatus of claim 1, wherein said first upper cladding layer is an n-type cladding layer.

3. The apparatus of claim 1, wherein said first upper cladding layer is a p-type cladding layer.

4. The apparatus of claim 1, wherein said second active layer is stacked atop portion of said first upper cladding layer other than said first ridge-shape current injection region.

5. The apparatus of claim 1, wherein a first ohmic contact layer used as an electrically ground connection is provided atop said first ridge-shape current injection region.

6. A method for forming a dual wavelength semiconductor laser emitting apparatus comprising the steps of:
    (a) providing a substrate having a first laser emitting device having a first lower cladding layer, a first active layer and a first upper cladding layer, said first upper cladding layer comprising a first ridge shape current injection region; and
    (b) stacking a second active layer and a second upper cladding layer of a second laser emitting device atop said first upper cladding layer making said first upper cladding layer as a second lower cladding layer of said second laser emitting device.

7. The method of claim 6, wherein said first upper cladding layer is an n-type cladding layer.

8. The method of claim 6, wherein said first upper cladding layer is a p-type cladding layer.

9. The method of claim 6, wherein said second active layer is stacked atop portion of said first upper cladding layer other than said first ridge-shape current injection region.

10. The method of claim 6, further comprising the steps of:
    (c) patterning said second upper cladding layer to form a second ridge-shape current injection region; and
    (d) forming a first ohmic contact layer and a second ohmic contact layer respectively atop said first ridge-shape current injection region and said second ridge-shape current injection region.

11. The method of claim 10, wherein said first ohmic contact layer is used as an electrically ground connection.

12. The method of claim 10, wherein said step (c) further comprises defining at least one trench on said second upper cladding layer to form said second ridge-shape current injection region.

13. A method for forming a dual wavelength semiconductor laser emitting apparatus comprising the steps of:
    (a) providing a substrate having a first laser emitting device having a first lower cladding layer, a first active layer and a first upper cladding layer, said first upper cladding layer comprising a first ridge-shape current injection region;
    (b) stacking a second active layer and a second upper cladding layer of a second laser emitting device atop said first upper cladding layer making said first upper cladding layer as a second lower cladding layer of said second laser emitting device;
    (c) patterning said second upper cladding layer to form a second ridge-shape current injection region; and
    (d) forming a first ohmic contact layer and a second ohmic contact layer respectively atop said first ridge-shape current injection region and said second ridge-shape current injection region.

14. The method of claim 13, wherein said first upper cladding layer is an n-type cladding layer.

15. The method of claim 13, wherein said first upper cladding layer is a p-type cladding layer.

16. The method of claim 13, wherein said second active layer is stacked atop portion of said first upper cladding layer other than said first ridge-shape current injection region.

17. The method of claim 13, wherein said first ohmic contact layer is used as an electrically ground connection.

18. The method of claim 13, wherein said step (c) further comprises defining at least one trench on said second upper cladding layer to form said second ridge-shape current injection region.

* * * * *